(12) United States Patent
Choi

(10) Patent No.: US 8,102,722 B2
(45) Date of Patent: Jan. 24, 2012

(54) DATA OUTPUT DEVICE FOR SEMICONDUCTOR MEMORY APPARATUS

(75) Inventor: Hong-Sok Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 276 days.

(21) Appl. No.: 12/494,377

(22) Filed: Jun. 30, 2009

(65) Prior Publication Data

US 2010/0165751 A1 Jul. 1, 2010

(30) Foreign Application Priority Data

Dec. 31, 2008 (KR) ........................ 10-2008-0138462

(51) Int. Cl.
*G11C 7/10* (2006.01)
(52) U.S. Cl. ..................... 365/189.05; 365/194
(58) Field of Classification Search ............. 365/189.05, 365/194
See application file for complete search history.

(56) References Cited

U.S. PATENT DOCUMENTS

| | | | | |
|---|---|---|---|---|
| 7,148,733 B2 * | 12/2006 | Takai | ........................... | 327/276 |
| 7,224,179 B2 * | 5/2007 | Kim | ................... | 326/26 |
| 7,598,785 B2 * | 10/2009 | Im et al. | ........................ | 327/170 |
| 2008/0088611 A1 | 4/2008 | Yeon | | |
| 2008/0205531 A1 | 8/2008 | Chan | | |
| 2009/0116315 A1 | 5/2009 | Choi | | |

FOREIGN PATENT DOCUMENTS

| | | |
|---|---|---|
| JP | 11-055515 | 2/1999 |
| KR | 1020080100055 A | 11/2008 |
| KR | 1020080100948 A | 11/2008 |

OTHER PUBLICATIONS

Notice of Preliminary Rejection issued from Korean Intellectual Property Office on Jun. 30, 2010.

* cited by examiner

*Primary Examiner* — Son Dinh
*Assistant Examiner* — Nam Nguyen
(74) *Attorney, Agent, or Firm* — IP & T Group LLP

(57) ABSTRACT

A data output device of a semiconductor memory apparatus includes detection means configured to detect a specified operation frequency range; pre-driving means configured to be inputted with signals; driving means configured to receive outputs of the pre-driving means and drive an output of data; and adjustment means configured to adjust a slew rate of the driving means under the control of an output signal of the detection means.

20 Claims, 4 Drawing Sheets

DATA OUTPUT DEVICE FOR SEMICONDUCTOR MEMORY APPARATUS

CROSS-REFERENCE TO RELATED APPLICATION

The present application claims priority of Korean Patent Application No. 10-2008-0138462, filed on Dec. 31, 2008, which disclosure is incorporated herein by reference in its entirety.

BACKGROUND OF THE INVENTION

The present invention relates to a semiconductor memory apparatus, and more particularly, to a data output device for controlling data output operation.

Semiconductor memory apparatuses are being used in most electronic products. For example, semiconductor memory apparatuses are being used in numerous electronic products such as personal computers, televisions, audio sets and communication terminals. In use, semiconductor memory apparatuses receive and store data from different electronic elements or appliances, provide the stored data to different electronic elements or appliances upon request, etc. Accordingly, the semiconductor memory apparatuses require circuits or devices associated with the input and output of data between the different electronic elements or appliances and the semiconductor memory apparatuses. That is to say, the semiconductor memory apparatuses require circuits or devices for transmitting and receiving data to and from the different electronic elements or appliances.

FIG. 1 is a circuit diagram illustrating a conventional data output device of a semiconductor memory apparatus.

Referring to FIG. 1, a conventional data output device includes pre-driving elements and driving elements having a predetermined size. That is to say, inverters 1 and 3 are connected to a signal input terminal DRVH as pre-driving elements, and PMOS transistors 21 and 23 are connected to the respective inverters 1 and 3 as driving elements. The PMOS transistors 21 and 23 have gate terminals which are connected to the output terminals of the inverters 1 and 3, source terminals through which a supply voltage (VDD) is provided, and drain terminals which are connected to an output terminal DQ.

Also, buffers 31 and 33 are connected to a signal input terminal DRVL as pre-driving elements, and NMOS transistors 41 and 42 are connected to the respective buffers 31 and 33 as driving elements. The NMOS transistors 41 and 42 have gate terminals which are connected to the output terminals of the buffers 31 and 33, source terminals which are connected to ground, and drain terminals which are connected to the output terminal DQ.

In the conventional data output device of a semiconductor memory apparatus configured as described above, when an input signal DRVH has a high level, the high signal is inverted by the inverters 1 and 3, and low signals are applied to the gate terminals of the respective PMOS transistors 21 and 23, by which the PMOS transistors 21 and 23 are turned on. As the PMOS transistors 21 and 23 are turned on, a supply voltage is supplied to the output terminal DQ, and a high signal is outputted from the output terminal DQ.

Conversely, when an input signal DRVL has a high level, high signals are applied to the gate terminals of the respective NMOS transistors 41 and 42 by the buffers 31 and 33, by which the NMOS transistors 41 and 42 are turned on. As the NMOS transistors 41 and 42 are turned on, a current path is formed from the output terminal DQ to the ground source, and a low signal is outputted from the output terminal DQ.

The conventional data output device of a semiconductor memory apparatus, which operates as described above, has problems as follows. In general, if the slew rate of an output data signal is small, a better performance is obtained in terms of an EMI (electromagnetic interference). However, if the slew rate of the output data signal is decreased by changing the size of the pre-driving elements or the driving elements so as to decrease an EMI level, data valid window (tDV) is reduced. Furthermore, in the case where an operation frequency is increased, the degradation of tDV becomes significant.

SUMMARY OF THE INVENTION

An embodiment of the present invention is directed to providing a data output device of a semiconductor memory apparatus which can decrease an EMI level.

An embodiment of the present invention is directed to providing a data output device of a semiconductor memory apparatus which can control data valid window not to be reduced in a high operation frequency.

In accordance with an aspect of the present invention, there is provided a data output device of a semiconductor memory apparatus, including detection means configured to detect a specified operation frequency range; pre-driving means configured to be inputted with signals; driving means configured to receive outputs of the pre-driving means and drive an output of data; and adjustment means configured to adjust a slew rate of the driving means under the control of an output signal of the detection means.

In accordance with another aspect of the present invention, there is provided a data output device of a semiconductor memory apparatus, including an output driver configured to be inputted with, amplify and output a signal; and control means configured to detect a specified operation frequency range and control a slew rate of the output driver at the specified operation frequency range.

In accordance with another aspect of the present invention, there is provided a data output device of a semiconductor memory apparatus, including a plurality of output drivers configured to be inputted with, amplify and output a signal to an output terminal; and control means configured to detect a specified operation frequency range and control slew rates of the plurality of output drivers at the specified operation frequency range.

In accordance with another aspect of the present invention, there is provided a data output device of a semiconductor memory apparatus, including detection means configured to detect a specified operation frequency range; a plurality of pre-driving means configured to be inputted with signals; a plurality of driving means configured to receive outputs of the pre-driving means and drive an output of data; and adjustment means configured to control the number of operable driving means under the control of an output signal of the detection means.

DESCRIPTION OF SPECIFIC EMBODIMENTS

Other objects and advantages of the present invention can be understood by the following description, and become apparent with reference to the embodiments of the present invention.

Figure 1:
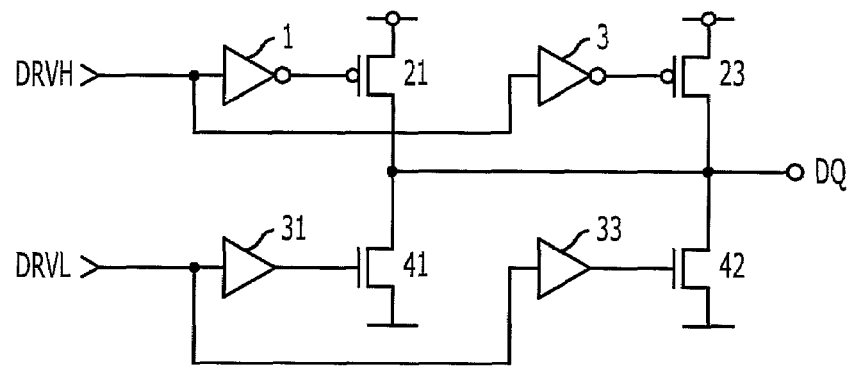
FIG. 1 is a view illustrating a conventional data output device of a semiconductor memory apparatus.
Figure 2:
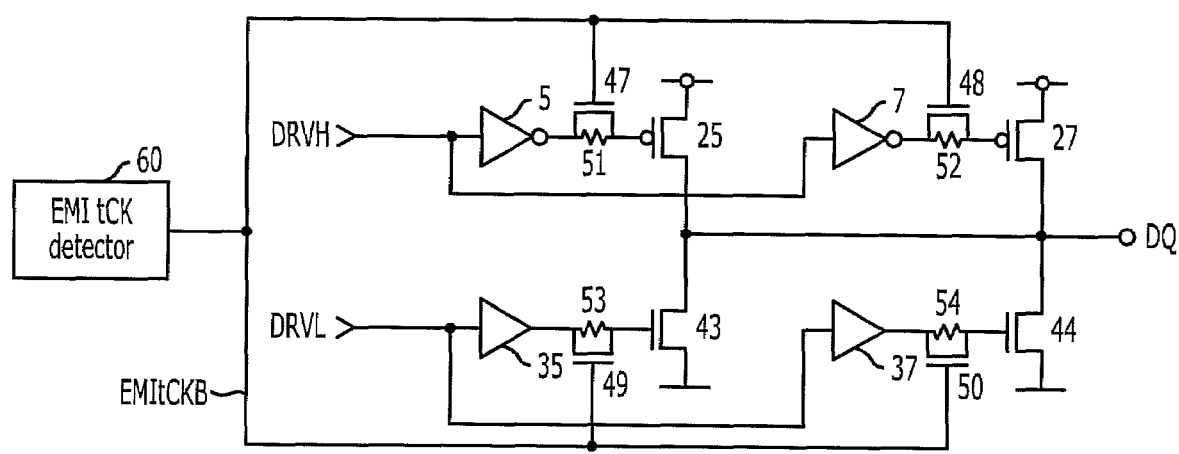
FIG. 2 is a view illustrating a data output device of a semiconductor memory apparatus in accordance with an embodiment of the present invention.

FIG. 2 is a view illustrating a data output device of a semiconductor memory apparatus in accordance with an embodiment of the present invention.

In the present invention, in order to decrease an EMI level that becomes significant at a specified operation frequency range (for example, when tCK=2.5 ns, which is within a certain frequency window) and increase data valid window at a high frequency, by detecting an operation frequency, control is implemented such that a slew rate is decreased when data output occurs at the specified frequency and is increased at the other operation frequencies. To this end, in the present invention, as shown in the drawing, a data output device of a semiconductor memory apparatus in accordance with an embodiment of the present invention includes a detector (EMI tCK detector) 60 for detecting the specified operation frequency range.

The data output device of a semiconductor memory apparatus further includes pre-driving elements and driving elements having a predetermined size. That is to say, inverters 5 and 7 are connected to a signal input terminal DRVH as pre-driving elements, and PMOS transistors 25 and 27 are connected to the respective inverters 5 and 7 as driving elements. The PMOS transistors 25 and 27 have gate terminals which are connected to the output terminals of the inverters 5 and 7, source terminals through which a supply voltage (VDD) is provided, and drain terminals which are connected to an output terminal DQ. A resistor 51 is connected between the inverter 5 and the PMOS transistor 25, and an NMOS transistor 47 is connected to both ends of the resistor 51. The NMOS transistor 47 is configured to be controlled by the output signal of the detector 60. Also, a resistor 52 is connected between the inverter 7 and the PMOS transistor 27, and an NMOS transistor 48 is connected to both ends of the resistor 52. The NMOS transistor 48 is configured to be controlled by the output signal of the detector 60.

Therefore, if a control signal generated by the detector 60 at a certain operation frequency controls and turns on the NMOS transistor 47, as a current path of the NMOS transistor 47 is formed between the inverter 5 and the PMOS transistor 25, the output signal of the inverter 5 is transmitted to the PMOS transistor 25 with no load. If the NMOS transistor 47 is turned off, a load by the resistor 51 exists between the inverter 5 and the PMOS transistor 25, and the output signal of the inverter 5 is transmitted to the PMOS transistor 25 through the resistor 51.

Similarly, if a control signal generated by the detector 60 at a certain operation frequency controls and turns on the NMOS transistor 48, as a current path of the NMOS transistor 48 is formed between the inverter 7 and the PMOS transistor 27, the output signal of the inverter 7 is transmitted to the PMOS transistor 27 with no load. If the NMOS transistor 48 is turned off, a load by the resistor 52 exists between the inverter 7 and the PMOS transistor 27, and the output signal of the inverter 7 is transmitted to the PMOS transistor 27 through the resistor 52.

Also, in the present invention, buffers 35 and 37 are connected to a signal input terminal DRVL as pre-driving elements, and NMOS transistors 43 and 44 are connected to the respective buffers 35 and 37 as driving elements. The NMOS transistors 43 and 44 have gate terminals which are connected to the output terminals of the buffers 35 and 37, source terminals which are connected to ground, and drain terminals which are connected to the output terminal DQ. A resistor 53 is connected between the buffer 35 and the NMOS transistor 43, and an NMOS transistor 49 is connected to both ends of the resistor 53. The NMOS transistor 49 is configured to be controlled by the output signal of the detector 60. Also, a resistor 54 is connected between the buffer 37 and the NMOS transistor 44, and an NMOS transistor 50 is connected to both ends of the resistor 54. The NMOS transistor 50 is configured to be controlled by the output signal of the detector 60.

Therefore, if a control signal generated by the detector 60 at a certain operation frequency controls and turns on the NMOS transistor 49, as a current path of the NMOS transistor 49 is formed between the buffer 35 and the NMOS transistor 43, the output signal of the buffer 35 is transmitted to the NMOS transistor 43 with no load. If the NMOS transistor 49 is turned off, a load by the resistor 53 exists between the buffer 35 and the NMOS transistor 43, and the output signal of the buffer 35 is transmitted to the NMOS transistor 43 through the resistor 53.

Similarly, if a control signal generated by the detector 60 at a certain operation frequency controls and turns on the NMOS transistor 50, as a current path of the NMOS transistor 50 is formed between the buffer 37 and the NMOS transistor 44, the output signal of the buffer 37 is transmitted to the NMOS transistor 44 with no load. If the NMOS transistor 50 is turned off, a load by the resistor 54 exists between the buffer 37 and the NMOS transistor 44, and the output signal of the buffer 37 is transmitted to the NMOS transistor 44 through the resistor 54.

Figure 3:
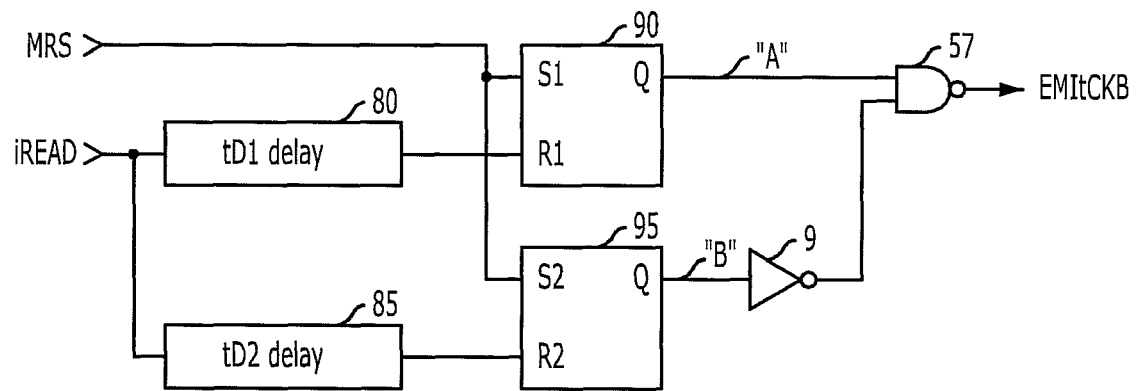
FIG. 3 is a detailed view of a detector shown in FIG. 2.

FIG. 3 is a detailed view of the detector 60 shown in FIG. 2.

The detector 60 includes two SR flip-flops 90 and 95, delay elements 80 and 85, an inverter 9 and a NAND gate 57. As a mode register set command MRS is supplied to set terminals S of the SR flip-flops 90 and 95, the SR flip-flops 90 and 95 are set. As an IREAD signal is supplied to reset terminals R of the SR flip-flops 90 and 95 after being delayed by preset delay amounts tD1 and tD2 in the delay elements 80 and 85, the SR flip-flops 90 and 95 are reset.

Figure 4:
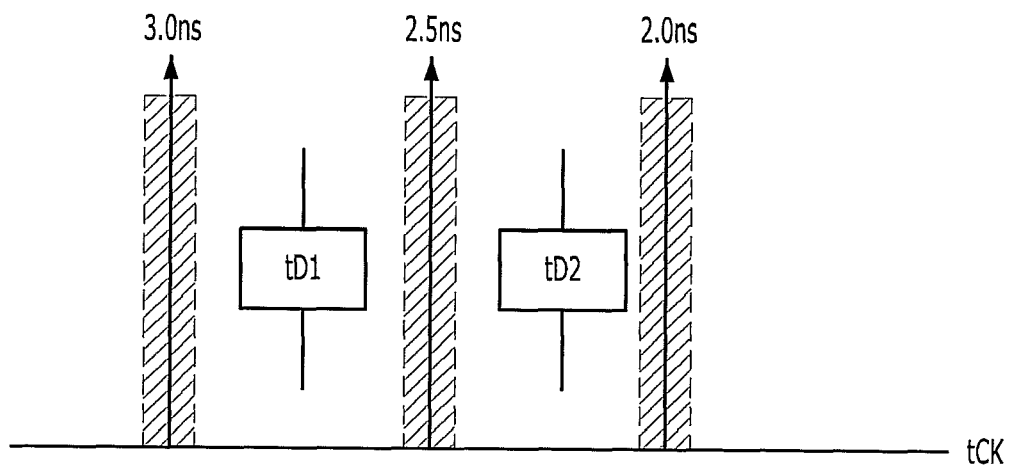
FIG. 4 is a view showing operation frequencies and delay amounts in accordance with an embodiment of the present invention.

The IREAD signal is an internal signal which has the same pulse width as a tCK for a read command. In order to decrease an EMI level, the delay amounts of the delay elements 80 and 85 are established as 2.75 ns (delay amount of tD1) and 2.25 ns (delay amount of tD2), which are respectively greater and less than the 2.5 ns of tCK that causes a problem in terms of EMI level. FIG. 4 illustrates the relationship between the delay amounts tD1 and tD2 having the delay elements 80 and 85 and operation frequencies.

An output signal of the SR flip-flop 90 becomes a first input signal of the NAND gate 57, and an output signal of the SR flip-flop 95 becomes a second input signal of the NAND gate 57 via the inverter 9. An output signal of the NAND gate 57 outputted in this way becomes a control signal which can control the slew rate of the data output device at a certain operation frequency, and is supplied to the NMOS transistors 47 through 50.

Hereafter, the operational procedure of the data output device of a semiconductor memory apparatus configured as mentioned above and a control method thereof will be described.

When an input signal DRVH has a high level, the high signal is inverted by the inverters 5 and 7, and low signals are applied to the gate terminals of the respective PMOS transistors 25 and 27, by which the PMOS transistors 25 and 27 are turned on. As the PMOS transistors 25 and 27 are turned on, a supply voltage is supplied to the output terminal DQ, and a high signal is outputted from the output terminal DQ.

Conversely, when an input signal DRVL has a high level, high signals are applied to the gate terminals of the respective NMOS transistors 43 and 44 via the buffers 35 and 37, by which the NMOS transistors 43 and 44 are turned on. As the NMOS transistors 43 and 44 are turned on, a current path is formed from the output terminal DQ to the ground source, and a low signal is outputted from the output terminal DQ.

While the above operations are executed, as the NMOS transistors 47 and 48, which are connected between the inverters 5 and 7 and the PMOS transistors 25 and 27, are controlled to be turned on or off, it is possible to adjust the slew rate of the output signal. Similarly, as the NMOS transistors 49 and 50, which are connected between the buffers 35 and 37 and the NMOS transistors 43 and 44, are controlled to be turned on or off, it is possible to adjust the slew rate of the output signal.

First, if an MRS command signal is inputted, the SR flip-flops 90 and 95 are set, and output signals A and B become high signals. The output signal B is inverted to a low signal by the inverter 9, and the NAND gate 57 outputs a high signal. Thus, the output signal EMItCKB of the detector 60 is in a high state. Thereafter, the output signal of the detector 60 is generated in response to the input of the IREAD signal.

Figure 5:
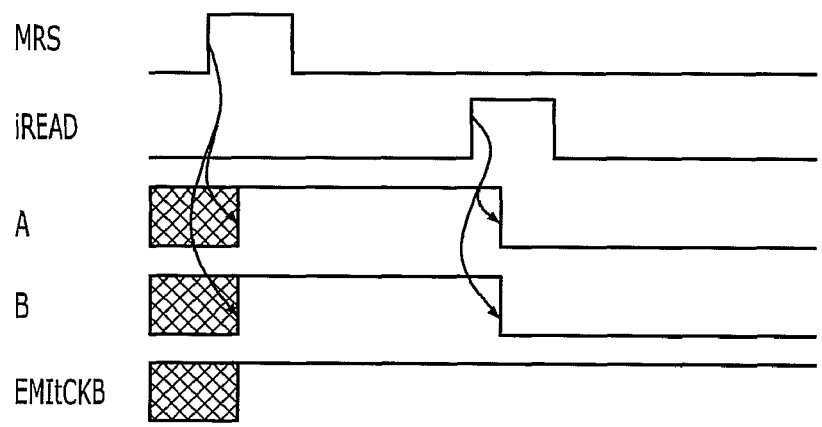
FIGS. 5 through 7 are waveform diagrams illustrating the outputs of the detector in conformance with some operation frequencies in the present invention.

For example, if the IREAD signal generated when tCK is 3.0 ns is inputted, the pulse width of the inputted signal is greater than the delay amounts having the delay elements 80 and 85. Hence, the IREAD input signal is inputted to the SR flip-flops 90 and 95 via the delay elements 80 and 85 and resets the SR flip-flops 90 and 95. Accordingly, all the output signals A and B of the SR flip-flops 90 and 95 become low signals, and the output signal of the NAND gate 57 becomes a high state, whereby the previous state (high state) is maintained. An operation timing diagram at this time is shown in FIG. 5.

Figure 6:
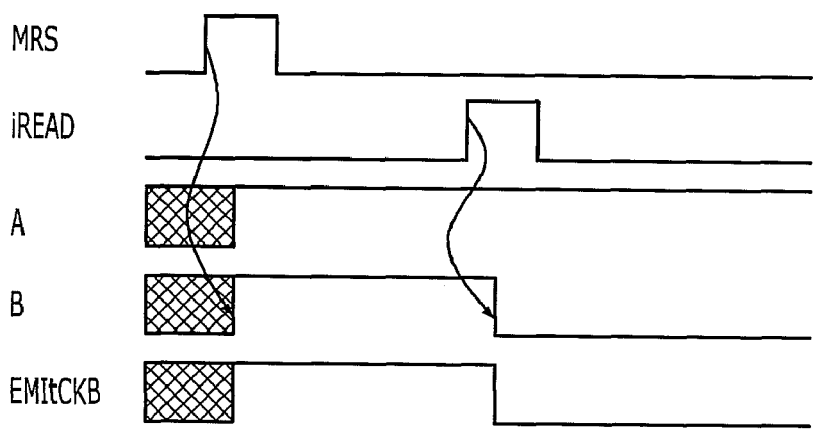

If the IREAD signal generated when tCK is in a 2.5 ns range is inputted, the pulse width of the inputted signal is greater than the delay amount having the delay element 85 but less than the delay amount (2.75 ns) having the delay element 80. Hence, the IREAD input signal resets the SR flip-flop 95, but does not reset the SR flip-flop 90. Accordingly, the output signal A of the SR flip-flop 90 maintains a high signal, and the output signal of the SR flip-flop 95 becomes a low signal. The low signal is inverted to a high signal by the inverter 9. The NAND gate 57 is inputted with two signals of a high state and outputs a low signal. That is to say, in this case, the output signal is converted from the previous high state to a low state. An operation timing diagram at this time is shown in FIG. 6.

Figure 7:
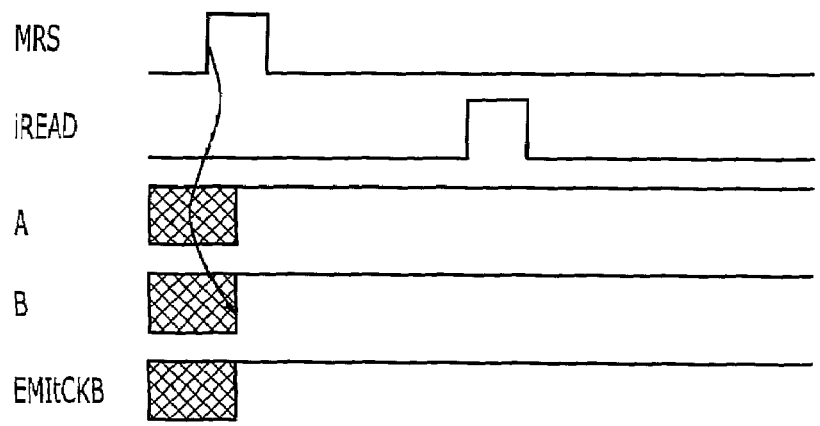

If the IREAD signal generated when tCK is 2.0 ns is inputted, the pulse width of the inputted signal is less than the delay amounts having the delay elements 80 and 85. Hence, the IREAD input signal does not reset the SR flip-flops 90 and 95. Accordingly, the output signals A and B of the SR flip-flops 90 and 95 maintain high signals. The output signal B is inverted to a low signal by the inverter 9. The NAND gate 57 outputs a high signal, and the previous state (high state) is maintained. An operation timing diagram at this time is shown in FIG. 7.

As can be readily seen from the above cases, the detector 60 outputs a low signal when tCK is in a 2.5 ns range and outputs a high signal in the other cases. In other words, the detector 60 generates a low signal at the specified operation frequency range (for example, tCK=2.5 ns) which causes a problem in terms of EMI level and a high signal at the other operation frequencies.

The control signal generated by the detector 60 as described above is provided to the gate terminals of the NMOS transistors 47 through 50 of the data output device. When the output signal of the detector 60 is a low signal, the NMOS transistors 47 through 50 maintain a turned-off state, and when the output signal of the detector 60 is a high signal, the NMOS transistors 47 through 50 are converted to a turned-on state.

When the NMOS transistors 47 through 50 are in the turned-on state, the resistors 51 and 52 between the inverters 5 and 7 as pre-driving elements and the PMOS transistors 25 and 27 as driving elements are bypassed. Similarly, the resistors 53 and 54 between the buffers 35 and 37 operating as pre-driving elements and the NMOS transistors 43 and 44 operating as driving elements are bypassed. In this way, the DQ slew rate with respect to the input signal is controlled to be fast, whereby tDV is improved.

Conversely, at the specified operation frequency range (for example, tCK=2.5 ns, which is between the values of the delays in the tD1 delay 80 and tD2 delay 85), the NMOS transistors 47 through 50 are controlled to the turned-off state, whereby the DQ slew rate is decreased and an EMI level is decreased. At this time, the NMOS transistors 47 through 50 are controlled to the turned-off state by the output of the low signal from the detector 60, and the resistors 51 and 52 are connected between the inverters 5 and 7 as pre-driving elements and the PMOS transistors 25 and 27 as driving elements. Furthermore, the resistors 53 and 54 are connected between the buffers 35 and 37 as pre-driving elements and the NMOS transistors 43 and 44 as driving elements. In this way, the DQ slew rate with respect to the input signal is decreased, and an EMI level is decreased.

Figure 8:
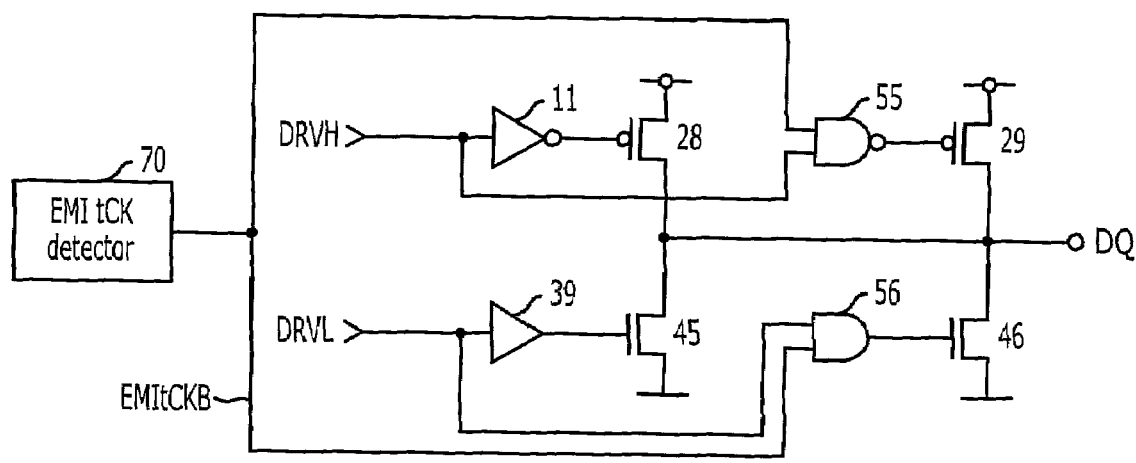
FIG. 8 is a view illustrating a data output device of a semiconductor memory apparatus in accordance with another embodiment of the present invention.

FIG. 8 is a view illustrating a data output device of a semiconductor memory apparatus in accordance with another embodiment of the present invention.

In the present embodiment, an output signal of a detector 70 controls the number of transistors, as driving elements, to be turned on upon output of data, whereby a DQ slew rate is controlled. The configuration and the operation of the detector 70 are the same as those as shown in FIG. 3.

When an input signal DRVH has a high level, the high signal is inverted by an inverter 11, and a low signal is supplied to the gate terminal of a PMOS transistor 28. Also, the input signal DRVH is supplied to the gate terminal of a PMOS transistor 29 via a NAND gate 55. Accordingly, as the PMOS transistors 28 and 29 are turned on, a supply voltage is supplied to an output terminal DQ, and a high signal is outputted from the output terminal DQ.

Conversely, when an input signal DRVL has a high level, a high signal is supplied to the gate terminal of an NMOS transistor 45 through a buffer 39. Also, the input signal DRVL is supplied to the gate terminal of an NMOS transistor 46 via an AND gate 56. Accordingly, as the NMOS transistors 45 and 46 are turned on, a current path is formed from the output terminal DQ to ground, and a low signal is outputted from the output terminal DQ.

While the above operations are executed, as the turn-on and turn-off operation of the PMOS transistor 29 and the NMOS transistor 46 is controlled by the output signal of the NAND gate 55 and the output signal of the AND gate 56, it is possible to adjust the slew rate of the output signal.

First, after an MRS command signal is inputted and the output signal of the detector 70 becomes a high state, if an IREAD signal generated when tCK is 3.0 ns is inputted, the detector 70 maintains a previous state (a high state). If an IREAD signal generated when tCK is in a 2.5 ns range is inputted, the detector 70 is converted from the previous state (the high state) to a low state. If an IREAD signal generated when tCK is 2.0 ns is inputted, the detector 70 maintains the previous state (the high state).

As can be readily seen from the above cases, the detector 70 outputs a low signal when tCK is in a 2.5 ns range and outputs a high signal in the other cases. In other words, the detector 70 generates a low signal at the specified operation frequency range (for example, tCK=2.5 ns) which causes a problem in terms of EMI level and a high signal at the other operation frequencies.

The control signal generated by the detector 70 as described above is provided to the NAND gate 55 and the AND gate 56 of the data output device as one input signal. When the output signal of the detector 70 is a low signal, the output signal of the NAND gate 55 becomes a high level. At this time, the PMOS transistor 29 is turned off. Similarly, when the output signal of the detector 70 is the low signal, the output signal of the AND gate 56 becomes a low level. At this time, the NMOS transistor 46 is turned off.

As the PMOS transistor 29 and the NMOS transistor 46 as driving elements are in the turned-off state in the foregoing manner, the two transistors are interrupted in their operation. Accordingly, when the detector 70 generates a low signal (at the specified operation frequency range when, for example, tCK=2.5 ns) for the driving elements of the data output device, only the PMOS transistor 28 and the NMOS transistor 45 operate normally. In this way, the DQ slew rate with respect to the input signal is decreased, whereby an EMI level is decreased.

Conversely, when the output signal of the detector 70 is a high signal, the output signal of the NAND gate 55 becomes a low level. At this time, the PMOS transistor 29 is turned on. Similarly, when the output signal of the detector 70 is the high signal, the output signal of the AND gate 56 becomes a high level. At this time, the NMOS transistor 46 is turned on.

As the PMOS transistor 29 and the NMOS transistor 46 as driving elements are in the turned-on state in this way, the two transistors operate normally. Accordingly, when the detector 70 generates a high signal (outside the specified operation frequency range when, for example, tCK=2.5 ns), all the driving elements of the data output device, that is, the PMOS transistors 28 and 29 and the NMOS transistors 45 and 46 operate normally. In this way, the DQ slew rate with respect to the input signal is increased, whereby tDV is improved.

As is apparent from the above description, in the present invention, a DQ slew rate is controlled to be fast in operation frequencies excluding a specified operation frequency range so that data valid window can be secured in a high frequency operation condition and to be slow in the specified operation frequency range so that an EMI level is suppressed from increasing.

The aforementioned preferred embodiments of the present invention have been disclosed for illustration purposes and can be applied to the case of controlling the operation of a data output driver so as to decrease an EMI level. Accordingly, while the present invention has been described with respect to the specific embodiments, it will be apparent to those skilled in the art that various changes and modifications may be made without departing from the spirit and scope of the invention as defined in the following claims.

What is claimed is:

1. A data output device of a semiconductor memory apparatus, comprising:
    detection means configured to detect a specified operation frequency range;
    pre-driving means configured to be inputted with signals;
    driving means configured to receive outputs of the pre-driving means and drive an output of data; and
    adjustment means configured to adjust a slew rate of the driving means under the control of an output signal of the detection means.

2. The data output device of claim 1, wherein the adjustment means comprises:
    resistors connected between the pre-driving means and the driving means; and
    control switching units connected to both ends of the resistors to be controlled by the detection means.

3. The data output device of claim 1, wherein the detection means comprises:
    delay elements having delay amounts to detect the specified operation frequency range; and
    a signal generation unit configured to generate a signal on the basis of output values of the delay elements.

4. The data output device of claim 3, wherein the delay elements comprise:
    a first delay element having a delay amount greater than a time corresponding to the specified operation frequency range; and
    a second delay element having a delay amount less than the time corresponding to the specified operation frequency range.

5. The data output device of claim 4, wherein the signal generation unit comprises:
    a first SR flip-flop configured to be set by a mode register set command and be reset by an output of the first delay element;
    a second SR flip-flop configured to be set by the mode register set command and be reset by an output of the second delay element; and
    an operation part configured to operate outputs of the first and second SR flip-flops and generate an output signal.

6. The data output device of claim 5, wherein the operation part comprises:
    an inverter configured to invert an output of the second SR flip-flop; and
    an operator configured to NAND an output of the first SR flip-flop and an output of the inverter.

7. A data output device of a semiconductor memory apparatus, comprising:
    an output driver configured to be inputted with, amplify and output a signal; and
    control means configured to detect a specified operation frequency range and control a slew rate of the output driver at the specified operation frequency range.

8. The data output device of claim 7, wherein the output driver comprises:
    pre-driving means configured to be inputted with signals; and
    driving means configured to receive outputs of the pre-driving means and drive an output of data.

9. The data output device of claim 8, wherein the control means comprises:
- detection means configured to detect a specified operation frequency range;
- adjustment means configured to adjust a slew rate of the driving means under the control of an output signal of the detection means.

10. The data output device of claim 9, wherein the adjustment means comprises:
- resistors connected between the pre-driving means and the driving means; and
- control switching units connected to both ends of the resistors to be controlled by the output signal of the detection means.

11. The data output device of claim 10, wherein the detection means comprises:
- delay elements having delay amounts to detect the specified operation frequency range; and
- a signal generation unit configured to generate a signal on the basis of output values of the delay elements and turn on or off the control switching units.

12. A data output device of a semiconductor memory apparatus, comprising:
- a plurality of output drivers configured to be inputted with, amplify and output a signal to an output terminal; and
- control means configured to detect a specified operation frequency range and control slew rates of the plurality of output drivers at the specified operation frequency range.

13. The data output device of claim 12, wherein the plurality of output drivers are configured in a push-pull type.

14. The data output device of claim 13, wherein the plurality of output drivers are configured by connecting a plurality of push-pull type drivers in parallel.

15. The data output device of claim 14, wherein the control means comprises:
- detection means configured to detect a specified operation frequency range;
- adjustment means configured to adjust slew rates of the drivers under the control of an output signal of the detection means.

16. The data output device of claim 15, wherein the adjustment means comprises:
- resistors connected between the drivers; and
- control switching units connected to both ends of the resistors to be controlled by the output signal of the detection means.

17. The data output device of claim 16, wherein the detection means comprises:
- delay elements having delay amounts to detect the specified operation frequency range; and
- a signal generation unit configured to generate a signal on the basis of output values of the delay elements and turn on or off the control switching units.

18. A data output device of a semiconductor memory apparatus, comprising:
- detection means configured to detect a specified operation frequency range;
- a plurality of pre-driving means configured to be inputted with signals;
- a plurality of driving means configured to receive outputs of the pre-driving means and drive an output of data; and
- adjustment means configured to control the number of operable driving means under the control of an output signal of the detection means.

19. The data output device of claim 18, wherein the adjustment means operates the output signal of the detection means and output signals of the plurality of pre-driving means and controls operation of the plurality of driving means.

20. The data output device of claim 19, wherein the detection means comprises:
- delay elements having delay amounts to detect the specified operation frequency range; and
- a signal generation unit configured to generate a signal on the basis of output values of the delay elements and turn on or off the adjustment means.

* * * * *